United States Patent
Aoyama et al.

(10) Patent No.: US 7,519,113 B2
(45) Date of Patent: Apr. 14, 2009

(54) NOISE DETECTION DEVICE

(75) Inventors: Kazunari Aoyama, Yamanashi (JP);
Minoru Nakamura, Fujiyoshida (JP);
Masahiro Miura, Yamanashi (JP)

(73) Assignee: Fanuc Ltd, Yamanashi (JP)

( * ) Notice: Subject to any disclaimer, the term of this patent is extended or adjusted under 35 U.S.C. 154(b) by 684 days.

(21) Appl. No.: 11/037,003

(22) Filed: Jan. 19, 2005

(65) Prior Publication Data
US 2005/0157829 A1 Jul. 21, 2005

(30) Foreign Application Priority Data
Jan. 21, 2004 (JP) .............. 2004-013234

(51) Int. Cl.
*H04B 3/46* (2006.01)
(52) U.S. Cl. .............. 375/227; 375/215; 375/294; 375/327; 375/371; 375/373; 324/76.53; 327/147; 327/156; 332/127; 342/103
(58) Field of Classification Search .......... 250/372; 331/11, 17; 375/227; 455/260; 327/157
See application file for complete search history.

(56) References Cited

U.S. PATENT DOCUMENTS

| 6,476,396 | B1 * | 11/2002 | Forsyth ........... 250/372 |
| 6,542,040 | B1 * | 4/2003 | Lesea ............... 331/11 |
| 2003/0222722 | A1 * | 12/2003 | Kwon ............... 331/17 |

FOREIGN PATENT DOCUMENTS

| DE | 44 17 115 | 3/1996 |
| JP | 01-307316 | 12/1989 |
| JP | 06-164380 | 6/1994 |
| JP | 2000-258238 | 9/2000 |
| JP | 2001-274679 | 10/2001 |
| JP | 2003-142586 | * 5/2003 |
| JP | 2003-287555 | * 10/2003 |
| JP | 2003-332442 | 11/2003 |

OTHER PUBLICATIONS

Notice of Reasons for Rejection, mailed Jun. 26, 2007 and issued in priority Japanese Patent Application No. 2004-013234.
EP Search Report for corresponding application EP 04 25 0278.8-2216 dated Sep. 6, 2005.

* cited by examiner

*Primary Examiner*—David C Payne
*Assistant Examiner*—Adolf Dsouza
(74) *Attorney, Agent, or Firm*—Staas & Halsey LLP

(57) ABSTRACT

Noise detection is performed by using the output of the phase comparator that the PLL comprises. The phase comparator outputs a signal that is based on the phase difference between the output of the voltage controlled oscillator and the reference signal. The phase difference reflects the effect of noise on the PLL and, in addition to the characteristics of the noise itself, such as the wave height value of the noise and the frequency component thereof, reflects the tolerance of the PLL to noise, whereby the level of risk that the system can actually be caused to malfunction can be judged.

11 Claims, 11 Drawing Sheets

LOW SENSITIVITY

MEDIUM SENSITIVITY

HIGH SENSITIVITY

NOISE DETECTION DEVICE

BACKGROUND OF THE INVENTION

1. Field of the Invention

The present invention relates to a noise detection device that detects noise occurring in each part of a printed circuit board by using a PLL (Phase Locked Loop).

2. Description of the Related Art

In a circuit used in various electrical and electronic devices, and so forth, noise detection and the like is applied in order to reduce the influence of malfunctions caused by noise interference.

Conventional methods of noise detection include, for example, a method that performs detection by convertinga shift in the signal value of the circuit used in the electrical or electronic device, or the similar, into a digital signal by means of an A/D converter and comparing the voltage value with a predetermined value (Japanese Patent Application Laid-Open No. 2000-258238, for example).

In a case where a voltage shift caused by noise is measured by using an A/D converter, because noise has normally a high frequency, high-speed conversion is required of the A/D converter, which makes the circuit very expensive. Because the circuit of the A/D converter increases in size as the speed of the A/D conversion increases, a large A/D converter cannot be installed in an electrical or electronic device with a limited size of a printed circuit board. As a result, the frequency that can be detected according to the circuit scale of the installed A/D converter is limited and detection of higher frequency noise is problematic. There is a problem that, for detection of high-frequency noise, the circuit has to be large-sized, with the result that electrical or electronic devices, and so forth become inevitably large.

There is also a problem that it is difficult to judge whether the detected noise is fatal for the system.

Generally, whether or not each of the circuit elements constituting the system circuit malfunctions due to noise depends on a variety of factors in addition to the noise voltage level, such as the frequency component with noise and randomness, and so forth. For this reason, judgment of whether or not the system is malfunctioning due to noise through the voltage level of the noise alone would be insufficient.

Further, with regard to the whole system in addition to each of the elements, the extent (criticality) of the effect of noise on the system differs according to a variety of factors such as the size of the noise, the noise frequency, the point at which the noise interference invades the system, and the tolerance of the circuit structure to the noise. A system usually has portions resistant to noise and also portions susceptible to noise, so that the system does not malfunction even when there is a large amount of noise at a portion that is resistant to noise, but the system malfunctions when there is even a small amount of noise at a portion that is susceptible to noise, on the other hand. Thus, as the effect of noise is determined according to variety of conditions, there is the problem that detection of the voltage level of the noise for single constituent circuit element would not suffice detection of the effect of noise on the whole system, thus actually making it difficult to determine whether or not there is a level of risk which will cause the system to malfunction.

Further, there is also the problem that mounting of a detection circuit is expensive and a space for mounting such detection circuit is required.

SUMMARY OF THE INVENTION

The present invention can judge whether or not there is a level of risk that will cause the system to actually malfunction, by detecting the existence of noise or by measuring the scale of noise from the operating state of a PLL that is an element the most susceptible to the effect of noise in the system.

According to the present invention, by using a PLL (frequency-variable clock generation circuit), noise detection that enables a high response speed and high frequency detection is possible and, by using a PLL that is mounted in an ASIC (Application Specific Integrated Circuit), not only it is possible to reduce the cost and size dramatically, but noise detection for each part of the printed circuit board and noise detection of each unit can be implemented easily.

Further, the present invention possesses the following advantages by using a PLL for noise detection.

The majority of current systems comprise a plurality of clocks in a system from a view point of advancement of CPUs and devices, and maintainability, and so forth. A PLL is mounted in order to constitute such a plurality of clocks.

Further, PLL is a circuit element that determines the frequency of an output clock by means of the control voltage of a voltage-controlled oscillator (VCO) and controls the circuit functions. On the other hand, the frequency tolerance of the PLL is readily affected by the characteristics of the loop filter and the effects of interference of the phase comparator and VCO. Therefore, in case where the output clock of the PLL becomes unstable due to noise, the risk of the system malfunctioning becomes high accordingly.

The present invention performs noise detection by detecting the operating state of a PLL that is liable to cause the system to malfunction, so that a special separate detection circuit for noise detection becomes unnecessary by using the PLL that the respective circuit structure comprises. Further, by using the PLL that each circuit structure originally comprises, the costs of a detector can be reduced and the space for mounting such a detector becomes unnecessary.

The present invention provides a noise detection device and an electronic device which comprises such a noise detection device.

The PLL used by the noise detection device of the present invention comprises a reference signal generator that generates a reference signal; a voltage controlled oscillator that controls the output frequency by means of an input voltage; and a phase comparator that compares the phase of the signal outputted from the voltage controlled oscillator with the phase of the reference signal, thereby outputting a signal that is in synchronization with the reference signal from the voltage controlled oscillator. In addition, a loop filter may be provided between the voltage controlled oscillator and the phase comparator.

In a first embodiment of the noise detection device according to the present invention, the output of the phase comparator that the PLL comprises is measured by means of measuring means and noise detection is performed by using the measurement result.

The phase comparator outputs a signal that is based on the phase difference between the reference signal and the output of the voltage controlled oscillator. This phase difference reflects the effect of noise on the PLL and, also reflects the tolerance of the PLL to noise, in addition to the characteristics of the noise itself, such as the wave height value of the noise and the frequency component thereof, whereby the level of risk that the system can actually be caused to malfunction can be judged.

Further, according to a second embodiment of the noise detection device according to the present invention, the output of the loop filter that the PLL comprises is measured by means of measuring means and noise detection is performed by using the measurement result.

The loop filter is a constituent element that removes the high frequency component from the output of the phase comparator and retrieves the DC component that is proportional to the phase difference. The loop filter reflects the effect of noise on the PLL, and also reflects the tolerance of the PLL to noise, in addition to the characteristics of the noise itself, such as the wave height value of the noise and the frequency component thereof, whereby the level of risk that the system can actually be caused to malfunction can be judged.

In addition, in the third embodiment of the noise detection device according to the present invention, the amount of jitter is measured by means of measuring means from the output signal of the PLL and noise detection is performed by using the measurement result.

The voltage controlled oscillator converts the output frequency according to a voltage that is based on the phase difference obtained by the phase comparator and loop filter. The output frequency fluctuates to compensate for shifts in the frequency, cycle, and so forth, that are generated under the influence of noise and the jitter amount expresses the scale of the noise affecting the PLL. In this aspect, noise is detected by measuring the jitter amount. The jitter amount reflects the tolerance of the PLL to noise in addition to the characteristics of the noise itself, such as the wave height value of the noise and the frequency component thereof, whereby the level of risk that the system can actually be caused to malfunction can be judged.

Each of the following embodiments can be applied to each of the aspects above.

The PLL is mounted in an ASIC and can be a PLL that is set for an ASIC specific application and/or a PLL that is set for noise detection. The ASIC is a specific-application IC with a circuit design that depends on the respective application. Therefore, a PLL that is set according to respective applications at the time of ASIC design can also be used as a noise detecting element. Further, the PLL can also be set separately for noise detection.

The noise detection device of each aspect comprises judging means for judging the existence of noise on the basis of the output of the measuring means. The judging means are able to judge the existence of noise by comparing the output value of the measuring means with a threshold value that is established beforehand, for example.

Further, the noise detection device of each aspect comprises noise value measuring means that measure the size of the shift in the phase or the scale of the jitter on the basis of the output of the measuring means. Further, the scale of the jitter can be an amount that includes the jitter wave height and jitter width, and so forth.

In addition, the noise detection device of the present invention comprises display means for displaying at least any one of the respective outputs of the measuring means, judging means, and noise value measuring means. The display means are able to display a warning when at least any one of the outputs exceeds a predetermined level. Further, the noise detection device of the present invention comprises storage means for storing noise information of the measuring means.

Further, the noise detection device of the present invention can be constituted such that it has a plurality of PLLs with different noise sensitivity characteristics on the same printed circuit board. With this configuration, the noise distribution on the printed circuit board can be detected and, by providing each PLL with a different noise sensitivity characteristic, it is possible to detect the distribution of the effect of noise on the circuit during an actual operation.

In addition, the noise detection device of the present invention comprises changing means for changing the noise sensitivity characteristic of the PLL. The changing means can be constituted such that it has a plurality of loop filters with different characteristics and switching means that selects and switches to any one of the loop filters. With this changing means, the output characteristics of the PLL can be changed.

The electronic device of the present invention is constituted such that it comprises a plurality of the above-mentioned noise detection device. This electronic device comprises position detection means that detect the position in which noise is detected on the basis of the output from the noise judging means that each of the noise detection devices comprises. With this position detection means, generation of noise can be detected according to the noise tolerance of each portion of the electronic device, so that it is possible to specify the point at which the noise occurred.

Further, the electronic device of the present invention comprises storage means for storing, within the system, noise information that is detected by the plurality of noise detection devices before and/or when the system alarm is generated and display means for displaying, when a system alarm is generated, the detection position of noise in case where the noise level exceeds a predetermined level on the basis of noise information stored by the storage means.

With this configuration, when the system detects an alarm, noise information at the time the alarm is generated and/or before the alarm is generated can be displayed.

The noise detection device of the present invention makes it possible to judge, via noise detection, whether there is a level of risk that the system can actually be caused to malfunction.

The noise detection device according to the present invention makes it possible to detect noise that is fatal to the system because a PLL that is the most sensitive to noise is used the system. Further, the PLL is installed in virtually all ASICs used by the system and the noise detection circuit can be implemented by means of simple circuit addition. Therefore, noise detection is possible at a large number of points in the system without an increase in costs.

BRIEF DESCRIPTION OF THE DRAWINGS

The above objects and characteristics and additional objects and characteristics of the present invention will become evident from the description of the following embodiments with reference to the drawings, in which.

DESCRIPTION OF THE PREFERRED EMBODIMENTS

Figure 1:
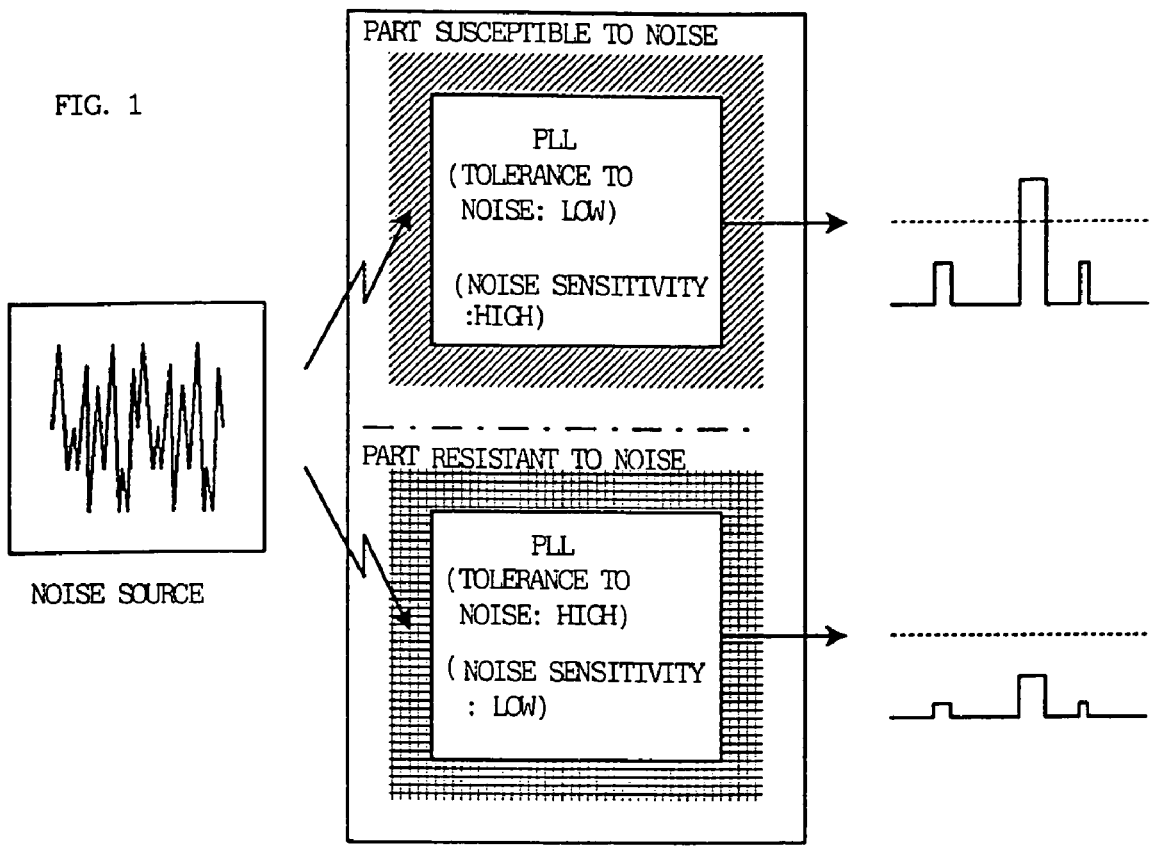
FIG. 1 is a schematic view to illustrate an outline of the noise detection device of the present invention.

FIG. 1 is a schematic view to illustrate an outline of the noise detection device of the present invention. The noise detection device according to the present invention performs noise detection by using the output from a PLL that is provided on a printed circuit board. As for the PLL used in the noise detection, a PLL, which is provided as a circuit constituent element on the printed circuit board, can be used or can be provided especially for noise detection.

The PLL is affected by noise from a noise source and, therefore, the signal strength, frequency, cycle, and signal waveform change. The noise detection device of the present invention performs noise detection on the basis of the signal in each part that constitutes the PLL.

In a printed circuit board, some parts are readily affected by noise, while other parts are not easily affected by noise. Therefore, effect of the noise varies dependent upon location of the printed circuit board even when the noise is derived from the same noise source. The PLL is an element the circuit elements of which are readily affected by noise and that exerts a large influence on the system. The noise detection device of the present invention detects how noise has an effect on an actually operating system by detecting how the noise has an effect on the PLL.

As shown in FIG. 1, PLLs are arranged in parts that are susceptible to noise and parts that are resistant to noise on the same printed circuit board and the effect of noise on these parts is detected on the basis of the output from the PLLs. A PLL with low noise tolerance and high noise sensitivity is provided in those parts which are susceptible to noise, while a PLL with high tolerance to noise and low noise sensitivity is provided in those parts which are resistant to noise.

As a result, when noise at a level that affects only parts that are susceptible to noise and does not affect parts that are resistant to noise occurs by the same noise source, noise detection is executed from the output of the PLL provided in those parts susceptible to noise, but noise detection is not performed from the output of the PLL that is provided in those parts resistant to noise.

In a configuration in which only a noise detector is provided, as in the case of the prior art, noise detection that distinguishes between parts that are susceptible to noise and parts that are resistant to noise on the same printed circuit board cannot be implemented and, even when a plurality of noise detectors are arranged on the printed circuit board, the noise detectors have the same detection sensitivity and are therefore unable to detect noise by distinguishing between parts that are susceptible to noise and parts that are resistant to noise. On the other hand, according to the noise detection device of the present invention, noise detection according to noise tolerance can be executed on the same printed circuit board.

Further, by using the PLL, it is possible to detect not only a noise level but also frequency, cycle, and so forth which serve as factors to determine whether the system actually malfunction or not.

Figure 2:
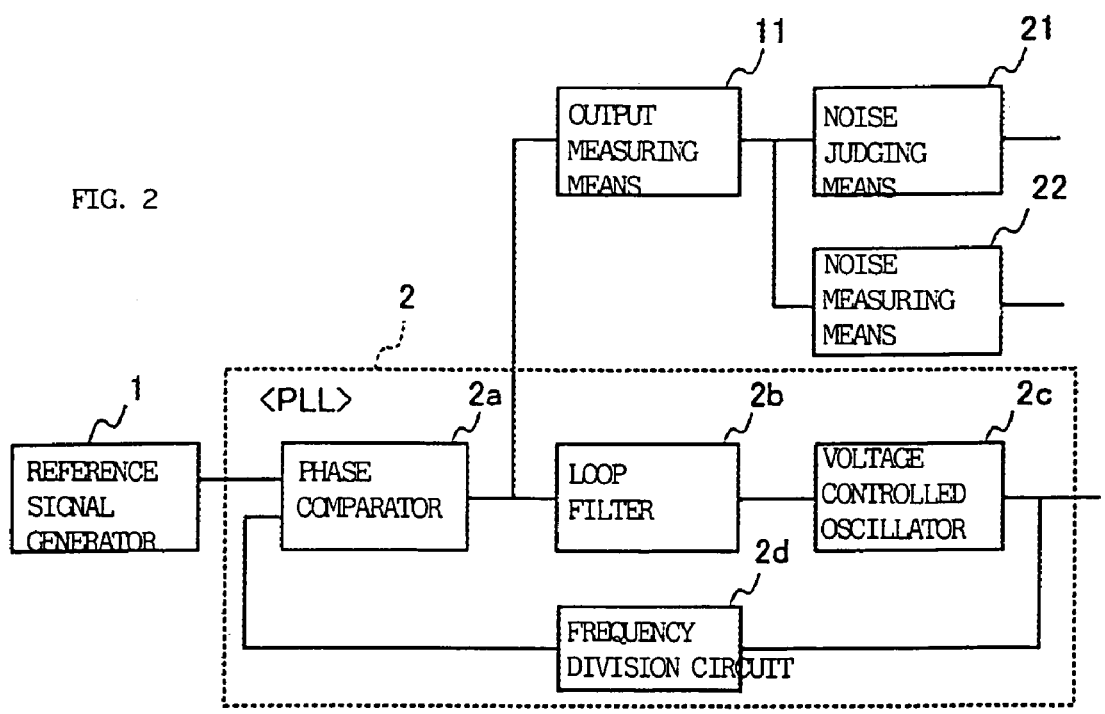
FIG. 2 is a block diagram showing a first embodiment of the noise detection device of the present invention.

FIG. 2 shows a first embodiment of the noise detection device of the present invention. In this embodiment, noise detection is performed by using the output of the phase comparator that the PLL comprises. The noise detection device comprises a reference signal generator 1 that generates a reference signal, a PLL 2, and output measuring means (first measuring means) 11 that measure the output of the PLL 2.

The PLL 2 comprises a voltage controlled oscillator 2c that controls the output frequency by means of an input voltage and a phase comparator that compares the phase of a signal that is outputted from the voltage controlled oscillator 2c with the phase of the reference signal, and a signal that is in synchronization with the reference signal is outputted by the voltage controlled oscillator 2c. The output of the phase comparator 2a, with high frequency component thereof being removed by means of a loop filter 2b, becomes input voltage to the voltage controlled oscillator 2c. Further, the output of the voltage controlled oscillator 2c may be frequency-divided at a predetermined ratio by means of a frequency division circuit 2d and then inputted to the phase comparator 2a. The provision of this frequency division circuit 2d makes it possible to form a frequency signal having a higher frequency than that of the reference signal.

The output measuring means (first measuring means) 11 measure the output from the phase comparator 2a of the PLL 2. The phase comparator 2a compares the signal from the voltage controlled oscillator 2c or from frequency division circuit 2d with the reference signal and outputs a pulse-shaped phase difference signal. The loop filter 2b consists of an integration circuit and a lowpass filter, for example, and performs a DC current conversion by blocking the high frequency component of the phase difference signal. The voltage controlled oscillator 2c adjusts the oscillation frequency on the basis of the inputted control voltage and performs a phase adjustment operation in conjunction with the reference signal. Generally, the voltage controlled oscillator 2c is controlled such that the difference from the phase of the reference signal becomes zero by lowering the oscillation frequency to delay the phase in case where the signal phase of the output from the voltage controlled oscillator is advanced, or by raising the oscillation frequency to advance the phase in case where the signal phase is delayed.

The phase comparator 2a outputs a signal that is based on the phase difference between the reference signal and the output of the voltage controlled oscillator 2c. This phase difference reflects the effect of noise on the PLL 2. In addition to the characteristics of the noise itself such as the wave height value of the noise and the frequency component thereof, the phase difference reflects the tolerance of the PLL 2 to noise. The output measuring means (first measuring means) 11 receives the output of the phase comparator 2a as a noise detection signal.

As shown in FIG. 2, noise judging means 21 and noise measuring means 22 can be connected to the output measuring means (first measuring means) 11. The noise judging means 21 judges the existence of noise on the basis of the output of the output measuring means (first measuring means) 11. This judgment can be performed by means of a comparison with a preset threshold value, for example. In addition, the noise measuring means 22 measures the scale of the noise on the basis of the output of the output measuring means (first measuring means) 11. The scale of the noise indicates an element such as a shift in the frequency of the noise or cycle shifts, or the like, in the PLL 2.

Figure 3:
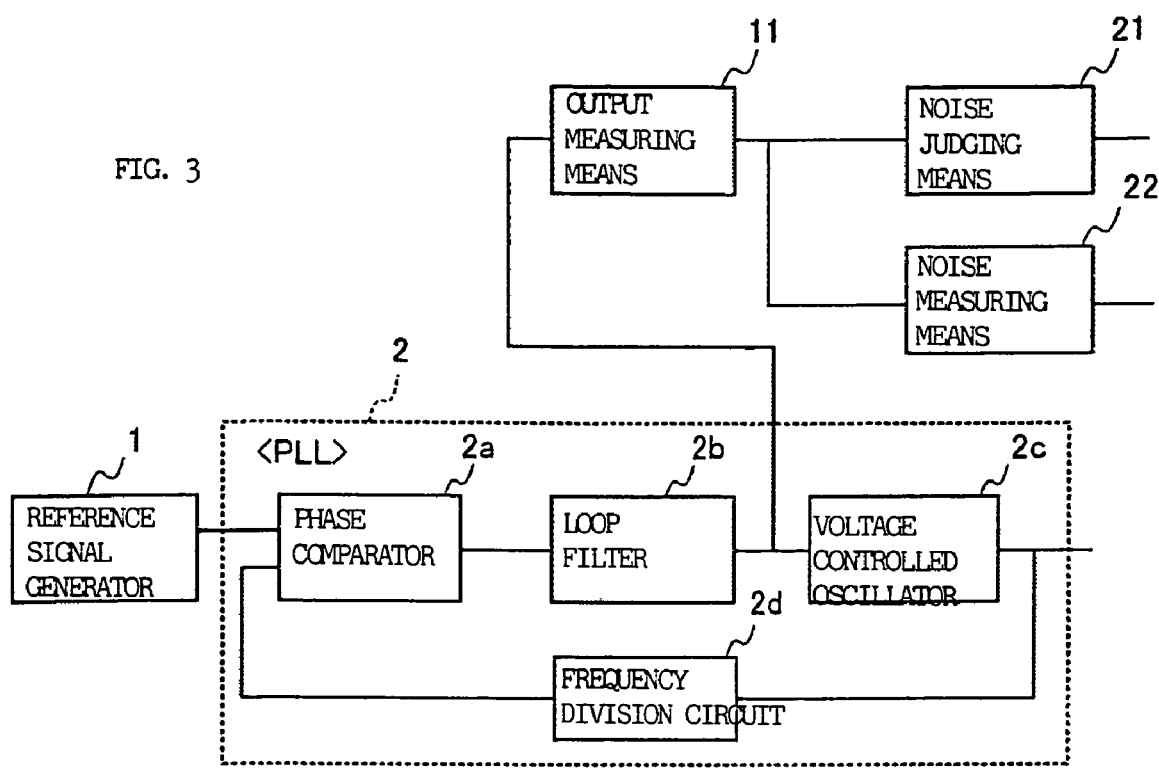
FIG. 3 is a block diagram showing a second embodiment of the noise detection device of the present invention.

FIG. 3 illustrates a second embodiment of the noise detection device of the present invention. In this embodiment, noise detection is performed by using the output of the loop filter that the PLL comprises.

The output of the loop filter is a signal that is based on the phase difference and, therefore, as shown in FIG. 3, the configuration of the noise detection device of this embodiment is substantially the same as that of the first embodiment shown in FIG. 2, but the output measuring means (second measuring means) 11 differs in that the output of the loop filter 2b is measured. Here, a description of the configuration that is common to that of the first embodiment will be omitted.

The loop filter 2b removed the high frequency component from the output of the phase comparator 2a and then retrieves the DC component that is proportional to the phase difference. The output of the loop filter 2b reflects the effect of noise on the PLL and, other than the characteristics of the noise itself, such as the wave height value of the noise and the frequency component thereof, the output reflects the tolerance of the PLL to noise and, therefore, the level of risk that the system can actually be caused to malfunction can be judged by using the output of the loop filter 2b.

Figure 4:
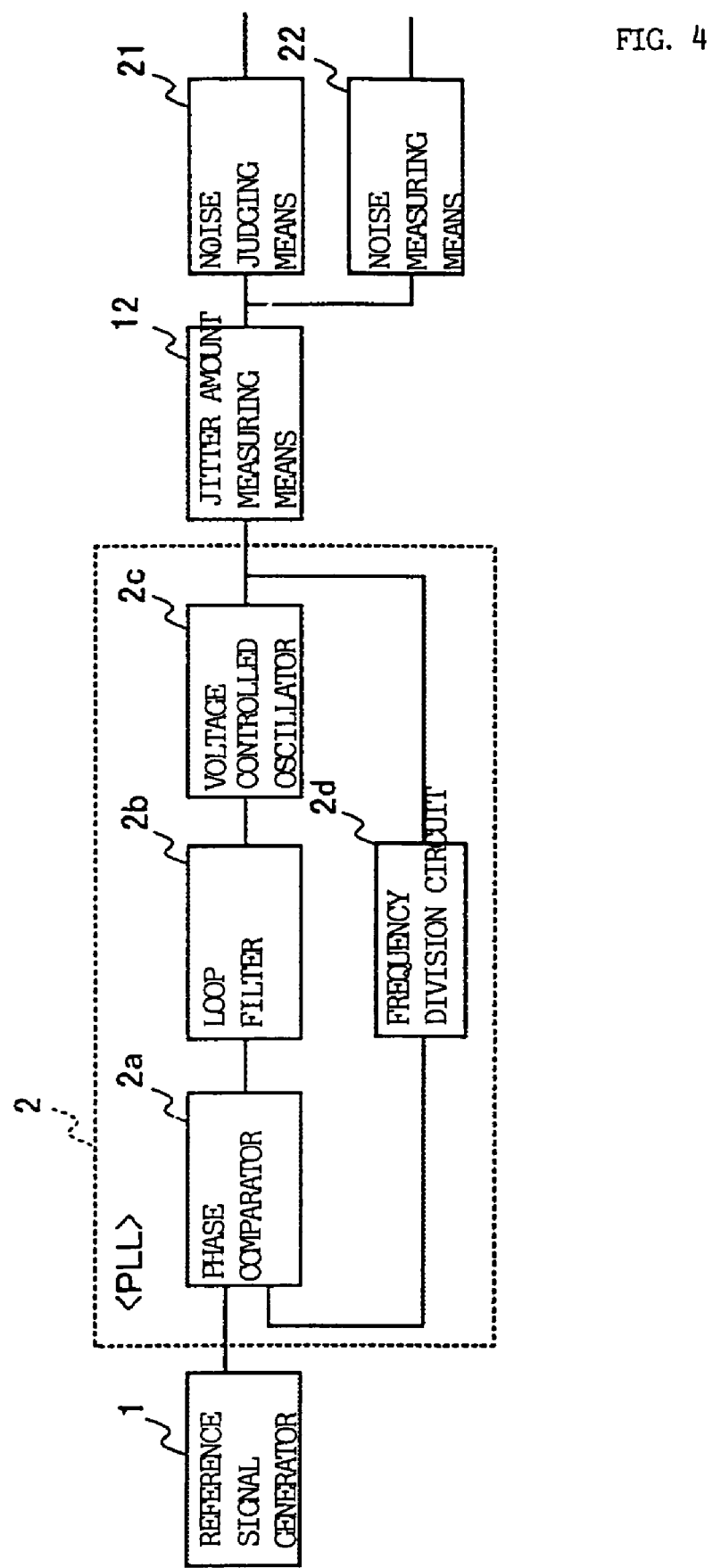
FIG. 4 is a block diagram showing a third embodiment of the noise detection device of the present invention.

FIG. 4 illustrates a third embodiment of the noise detection device of the present invention. In this embodiment, noise detection is performed by using the output of a PLL to measure the amount of jitter.

In FIG. 4, the configuration of the noise detection device is substantially the same as that of the first embodiment shown in FIG. 2 but differs in the fact that the output of the voltage controlled oscillator 2c is measured by means of the jitter amount measuring means 12, which constitute third measuring means. Here, a description of the configuration that is common to that of the first embodiment will be omitted.

The voltage controlled oscillator 2c controls the frequency by means of the voltage and changes the output frequency according to the voltage based on the phase difference that is obtained by the means of the phase comparator 2a and the loop filter 2b. This output frequency fluctuates to compensate for the shift in the frequency, cycle, or the like that is generated as a result of the effect of noise and the amount of jitter expresses the scale of the noise that exerts influence on the PLL 2. In this embodiment, noise is detected by measuring the amount of jitter. The amount of jitter reflects the tolerance of the PLL to noise in addition to the characteristics of the noise itself such as the wave height value of the noise and the frequency component thereof, and so forth, and makes it possible to judge the level of risk that the system can actually be caused to malfunction.

Figure 5:
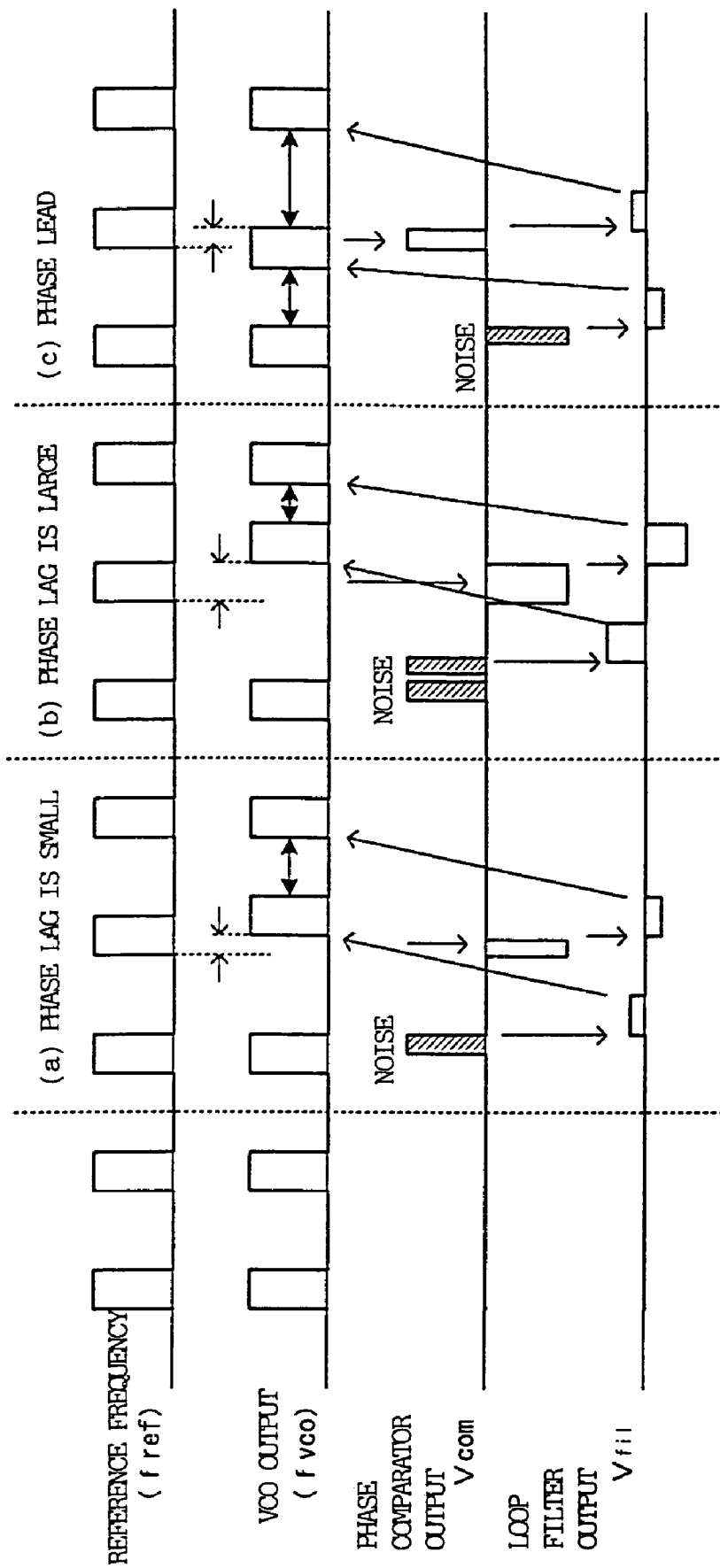
FIG. 5 illustrates the state of the signal of the PLL in a case where noise occurs in a phase comparator that the PLL comprises.
Figure 6:
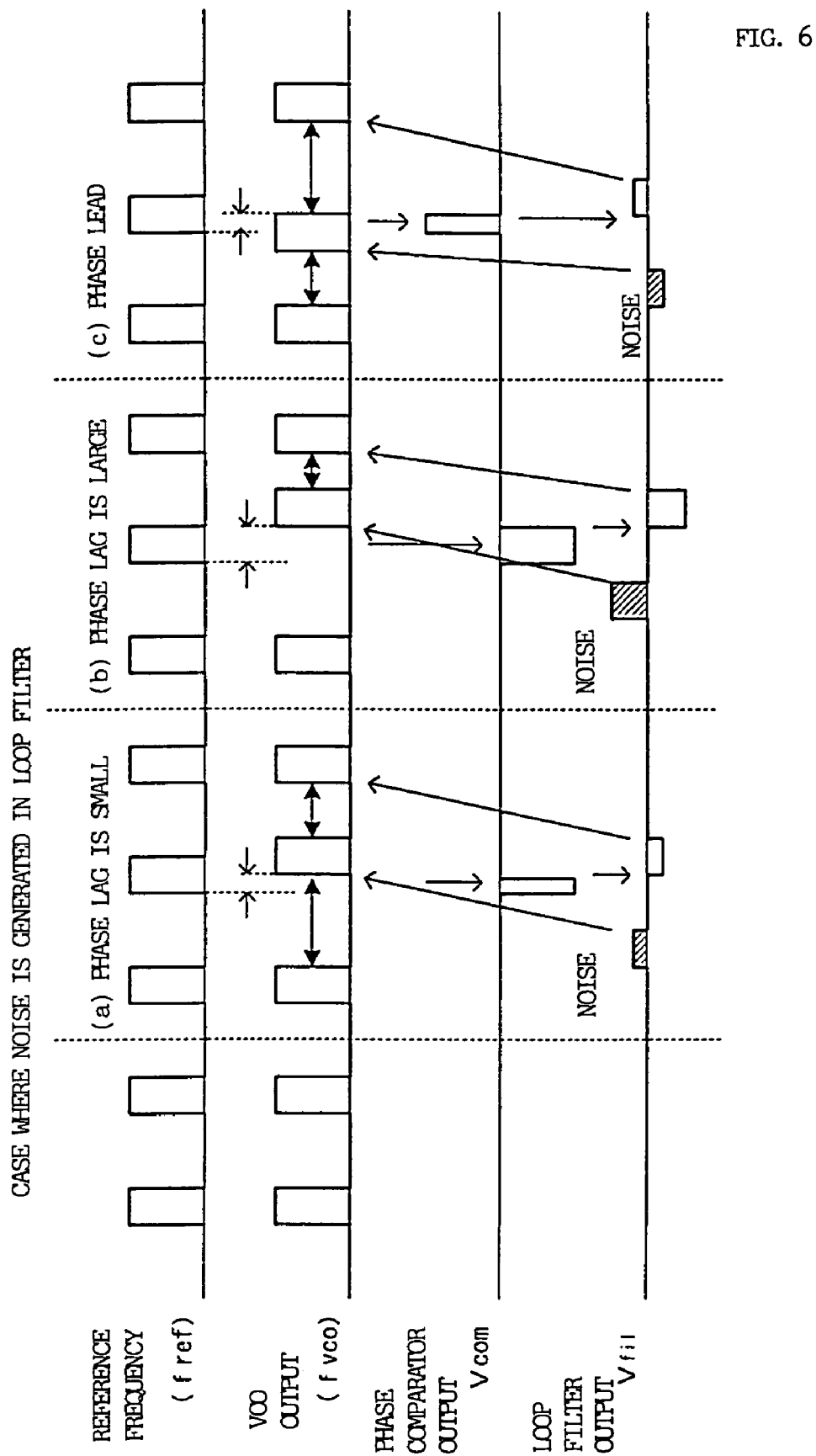
FIG. 6 illustrates the state of the signal of the PLL in a case where noise occurs in a loop filter that the PLL comprises.
Figure 7:
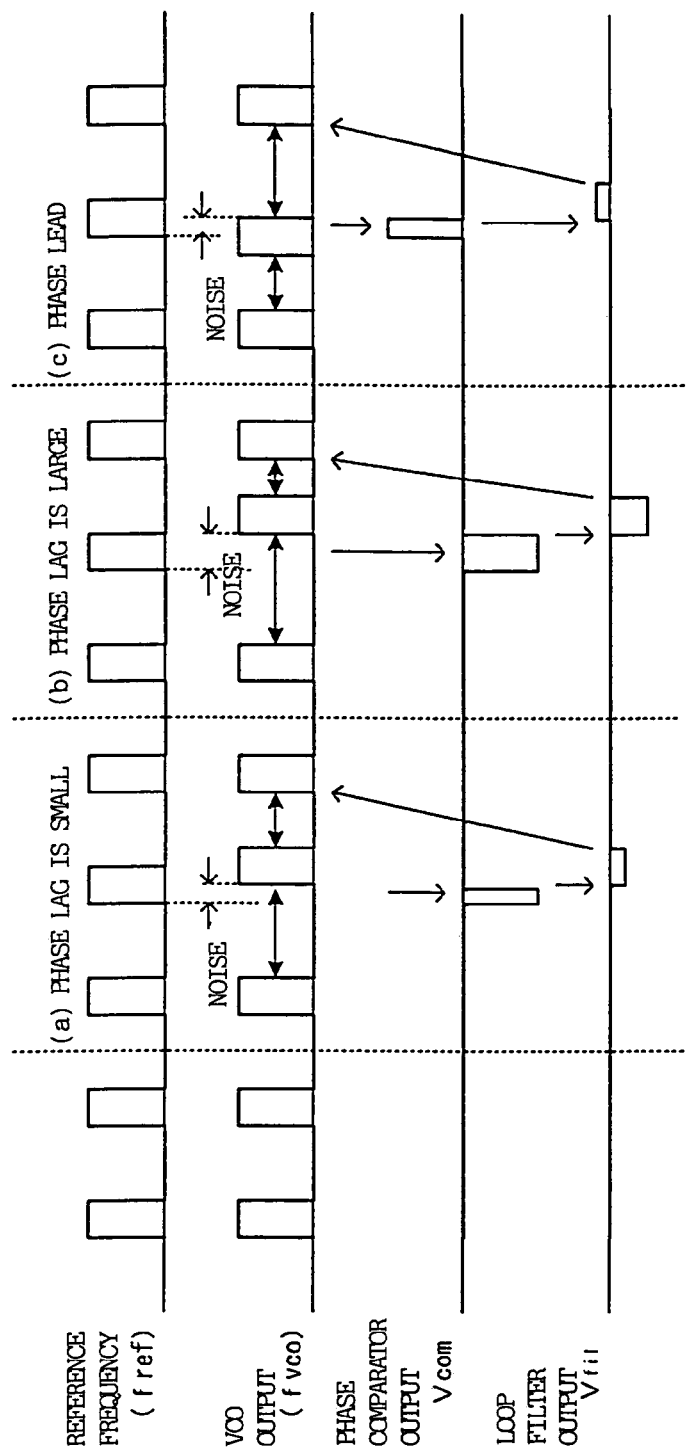
FIG. 7 illustrates the state of the signal of the PLL in a case where noise occurs in a voltage controlled oscillator that the PLL comprises.

Hereinafter, signals that are measured by the respective measuring means (the first to third measuring means) for the noise that has occurred in the respective parts of the PLL will be described by using FIGS. 5 to 7. Further, the signal example shown in FIGS. 5 to 7 is shown in a simplified form. Further, each of these figures shows the reference signal and the difference in output caused by the scale of the noise with respect to the output of the voltage controlled oscillator, the output of the phase comparator, and the output of the loop filter. FIGS. 5 to 7 show examples in which the scale of the noise is expressed as a phase difference and represent cases where (a) the phase delay of the output of the voltage controlled oscillator is large with respect to the reference signal, (b) the phase delay is small, and (c) a phase lead exists.

First, a case where noise occurs in the phase comparator will be described by using FIG. 5.

When noise (shown with oblique lines in FIG. 5) occurred in the phase comparator, the noise component is DC-converted by means of the loop filter and the frequency (cycle) of the voltage controlled oscillator is adjusted. (a) and (b) in FIG. 5 represent a case where a phase delay is generated by the noise. The phase comparator compares the output of the voltage controlled oscillator (phase delay) with a reference signal and outputs the comparison result as a phase difference signal and the loop filter DC-converts the phase difference corresponding to the phase delay. The voltage controlled oscillator adjusts the frequency (cycle) on the basis of the phase difference signal and thus matches the frequency to that of the reference signal.

The phase difference amount of the phase difference signal of the phase comparator and the wave-height value of the output of the loop filter vary according to the scale of the noise. (a) and (b) in FIG. 5 represent states where the phase delay of the output of the voltage controlled oscillator is small and large, respectively, according to the scale of the noise. Further, (c) in FIG. 5 represents a state where the output of the voltage controlled oscillator is expressed as a phase lead in accordance with the scale of the noise.

Further, the phase difference (comparator frequency (cycle)) of the voltage controlled oscillator varies according to the scale of the noise. In FIG. 5, this is expressed as the change in the interval (length of arrow) between the output signals of the voltage controlled oscillator.

Next, a case where noise occurs in a loop filter will be described by using FIG. 6.

In a case where noise (shown with the oblique lines in FIG. 6) occurs in a loop filter, the noise component adjusts the frequency (cycle) of the voltage controlled oscillator. (a) and (b) in FIG. 6 represent cases where a phase delay is generated as a result of noise. The phase comparator compares the phase lag of the output of the voltage controlled oscillator with the reference signal and outputs the comparison result as a phase different signal, and the loop filter DC-converts the phase difference corresponding to the phase lag. The voltage controlled oscillator adjusts the frequency (cycle) on the basis of the phase comparison signal to match the reference signal.

The phase difference amount of the phase difference signal of the phase comparator and the wave height value of the output of the loop filter vary according to the scale of the noise. (a) and (b) in FIG. 6 represent states where the phase delay of the output of the voltage controlled oscillator is small and large, respectively, according to the scale of the noise. Further, (c) in FIG. 5 represents a state where the output of the voltage controlled oscillator is expressed as a phase lead in accordance with the scale of the noise.

Further, the phase difference (comparator frequency (cycle)) of the output of the voltage controlled oscillator varies according to the scale of the noise. In FIG. 6, this phase difference is expressed as the change in the interval between the output signals of the voltage controlled oscillator (length of the arrow).

Similarly, a case where noise occurs in the voltage controlled oscillator will be described by using FIG. 7.

When noise occurs in the voltage controlled oscillator, the noise component is compared with the reference signal by means of the phase comparator and outputted as a phase difference signal, and the loop filter DC-converts the phase difference. The voltage controlled oscillator adjusts the frequency (cycle) on the basis of the phase comparison signal to match the reference signal.

The phase difference amount of the phase difference signal of the phase comparator and the wave height value of the output of the loop filter vary according to the scale of the noise. (a) and (b) in FIG. 7 represent states where the phase lag of the output of the voltage controlled oscillator is small and large, respectively, according to the scale of the noise. Further, (c) in FIG. 7 represents a state where the output of the voltage controlled oscillator is expressed as a phase lead in accordance with the scale of the noise.

In addition, the phase difference (comparator frequency (cycle)) of the output of the voltage controlled oscillator varies according to the scale of the noise. In FIG. 7, this is expressed as the change in the interval (length of the arrow) between the output signals of the voltage controlled oscillator.

The respective measuring means (first measuring means to third measuring means) of the noise detection device of the present invention perform noise detection on the basis of the output of the phase comparator, the output of the loop filter, and the output of the voltage controlled oscillator.

Figure 8:
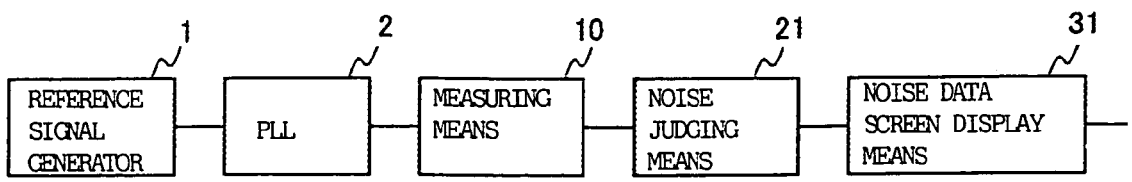
FIG. 8 is a block diagram showing an example in which the judgment result of noise judging means that the noise detection device according to the present invention comprises is displayed on the screen of display means.
Figure 9:
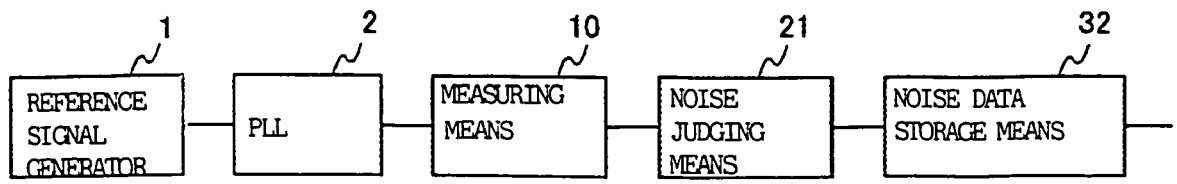
FIG. 9 is a block diagram showing an example in which the judgment result of noise judging means that the noise detection device according to the present invention comprises is stored in storage means.

The judgment result of the noise judging means 21 and the measurement result of the noise measuring means 22 can be stored by the storage means 32 in addition to being displayed by the screen display means 31 as shown in FIGS. 8 and 9. Further, FIGS. 8 and 9 only show the noise judging means 21, where illustration of the noise measuring means 22 is omitted.

Further, the noise detection device of the present invention is able to change the noise sensitivity of the PLL. The noise sensitivity of the PLL can be changed by changing the characteristic of the loop filter, for example. Further, in addition to the loop filter, the noise sensitivity of the PLL can also be changed by changing the characteristics of the voltage controlled oscillator and the characteristics of the power supply. The noise sensitivity of the loop filter can be changed by changing the integration constant by changing the condenser and resistance components, for example.

Further, the noise sensitivity of PLL can be changed by providing a plurality of loop filters (loop filter 1 and loop filter 2) with different noise sensitivities in the PLL 2 and selecting any one of them by means of switching means 2e.

Figure 11:
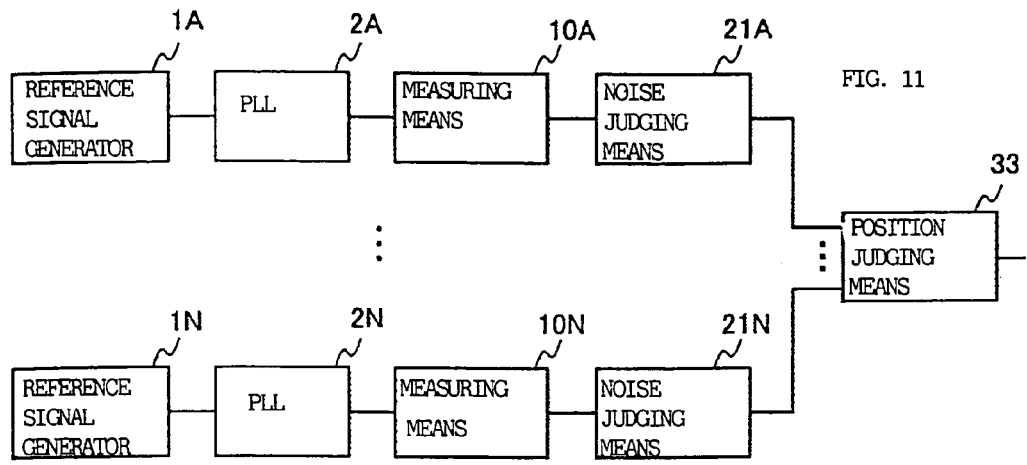
FIG. 11 is a block diagram illustrating measurement of the position in which noise occurs, noise distribution, and so forth by arranging a plurality of noise detection devices of the present invention on a printed circuit board and in an electronic device.

By arranging a plurality of the noise detection devices of the present invention on a printed circuit board or in an electronic device, and so forth, it is possible to measure the distribution of noise and the position in which the noise occurs. FIG. 11 is an example of a configuration that measures the position in which noise occurs and the noise distribution.

In FIG. 11, a plurality of noise detection devices comprising reference signal generators 1A to 1N, PLL 2A to 2N, measuring means 10A to 10N, and noise judging means 21A to 21N are provided on a printed circuit board or in each part of an electronic device and the noise judgment result obtained by the noise detection device is inputted to position judging means 33 to determine the position in which the noise occurred and the noise distribution.

Further, only a plurality of PLL may be installed, while reference signal generators, measuring means, and noise judging means are commonly used.

Figure 12A:
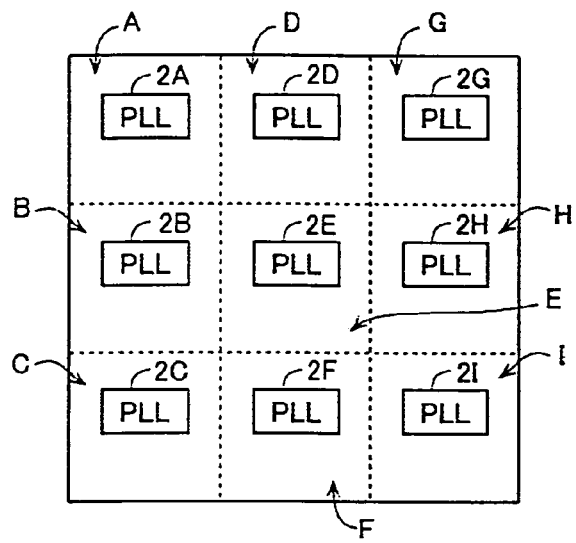
FIG. 12A shows an example in which the distribution of noise generation is measured by arranging a plurality of PLLs on the same printed circuit board.

FIG. 12A shows an example in which a plurality of PLLs are arranged on the same printed circuit board to measure a noise generation distribution. The placement example shown in FIG. 12A shows an example in which the printed circuit board is divided up into nine regions, namely, A, B, . . . , I, and PLL 2A, 2B, . . . , 2I are arranged in each region.

Figure 12B:
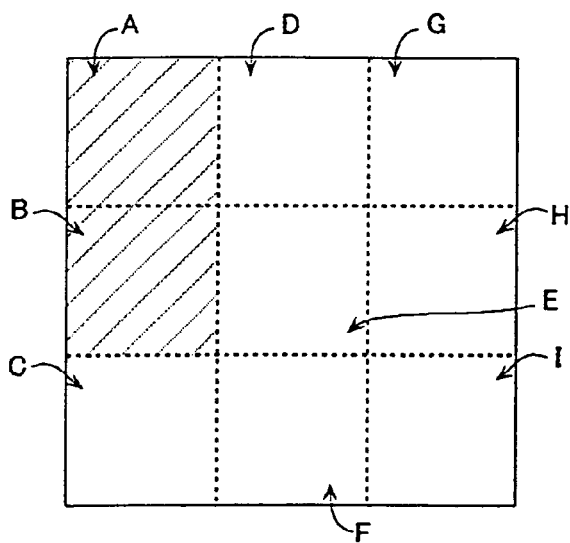
FIG. 12B is an example of a display of a noise generation distribution.

In a case where the noise affecting the system occurs in regions A and B, a noise detection signal is detected from the PLL 2A and PLL 2B that are arranged in each region. The screen display means 31 are able to display the noise distribution on the basis of these noise detection signals. FIG. 12B is an example of a noise distribution display.

Figure 13:
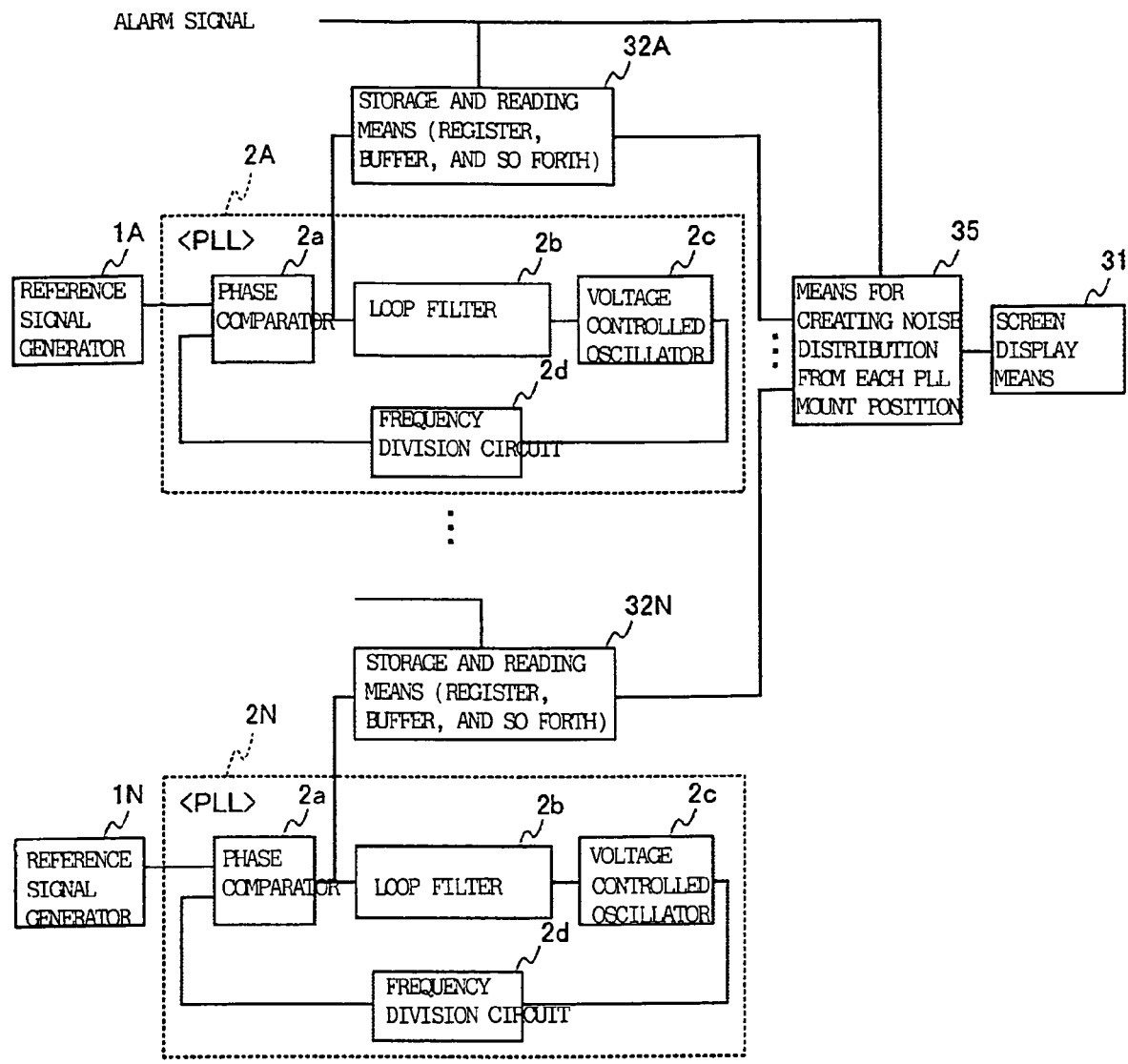
FIG. 13 is a block diagram showing an example in which the noise distribution when an alarm is emitted is measured by using a plurality of the noise detection devices according to the present invention.

The configuration can also be one in which the noise distribution is found in combination with alarm production. FIG. 13 shows an outline of an example of a configuration in which noise distribution at the time of alarm occurrence is measured.

In FIG. 13, N noise detection devices with the above configuration that includes the reference signal generators 1A to 1N and PLLs 2A to 2N comprises the respective storage means (storage and reading means) 32A to 32N. The respective storage means 32A to 32N are constituted by a register and a buffer, and so forth, and store the outputs from the PLL 2A to 2N. The storage means 32A to 32N are able to store past output data from the PLL 2A to 2N within a predetermined time interval from the current time by sequentially updating the output data of a predetermined recording capacity at all times. The time interval for the storage depends on the recording capacity of the storage means 32A to 32N and, therefore, the recording capacity of the storage means 32A to 32N is set according to the required time interval.

Further, the outputs of the PLL 2A to 2N stored by the storage means 32A to 32N can be the output of the phase comparator 2a, the output of the loop filter 2b, and the output of the voltage controlled oscillator 2c, and so forth, as shown in each of the embodiments above. Although the configuration example shown in FIG. 13 is one in which the output of the phase comparator 2a is stored, the output of the loop filter 2b or the output of the voltage controlled oscillator 2c can also be stored, or an optional output can also be stored in accordance with the configuration of the PLL and the dispositional position of the PLL and so forth.

The PLL output data stored by the storage means 32A to 32N is read out to noise distribution creation means 35 according to an input of an alarm signal. The noise distribution creation means 35 create a noise distribution on the basis of output data that is read out from the respective storage means 32 and displays the noise distribution on the screen display means 31. The position judging means 33 comprise a function to create a noise distribution from the mount position of each PLL, and are able to acquire the position of the PLL to create the noise distribution, by acquiring data on the installation position of each PLL that has been provided in advance or by acquiring data on the installation position from each PLL.

In noise distribution creation, in addition to creating a distribution at the time of noise occurrence by using noise data at the time of alarm generation, the noise distribution of a predetermined time interval until the noise occurs can also be created by using noise data within a predetermined time interval starting with generation of noise.

Figure 14:
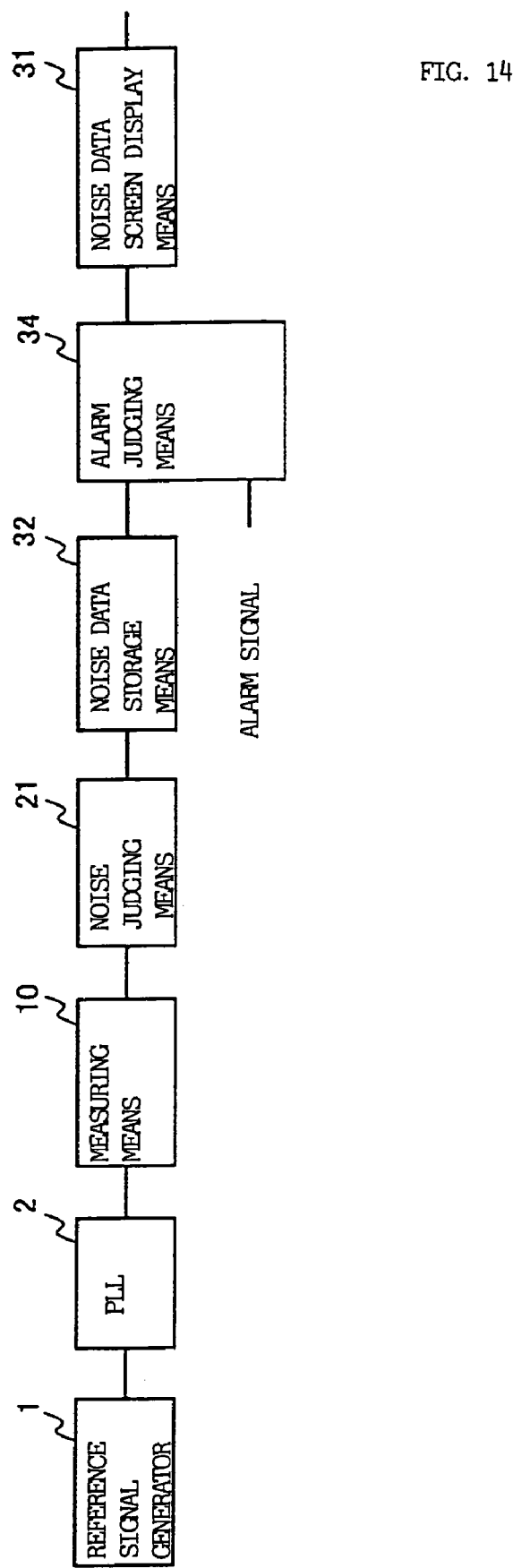
FIG. 14 is a block diagram showing an example in which it is judged, by using noise data when an alarm signal is inputted, whether or not the alarm is attributable to noise and in which the judgment result is displayed on a screen.

FIG. 14 is an example in which a combination of alarm production and noise data storage/display is implemented. As shown in FIG. 14, the output of the storage means (noise data storage means) 32 and the alarm signal are inputted to alarm judging means 34. Alarm judging means 34 judge whether the alarm is attributable to noise by using noise data at the time when the alarm signal is inputted and display the judgment result on the screen display means (noise data screen display means) 31.

Figure 10:
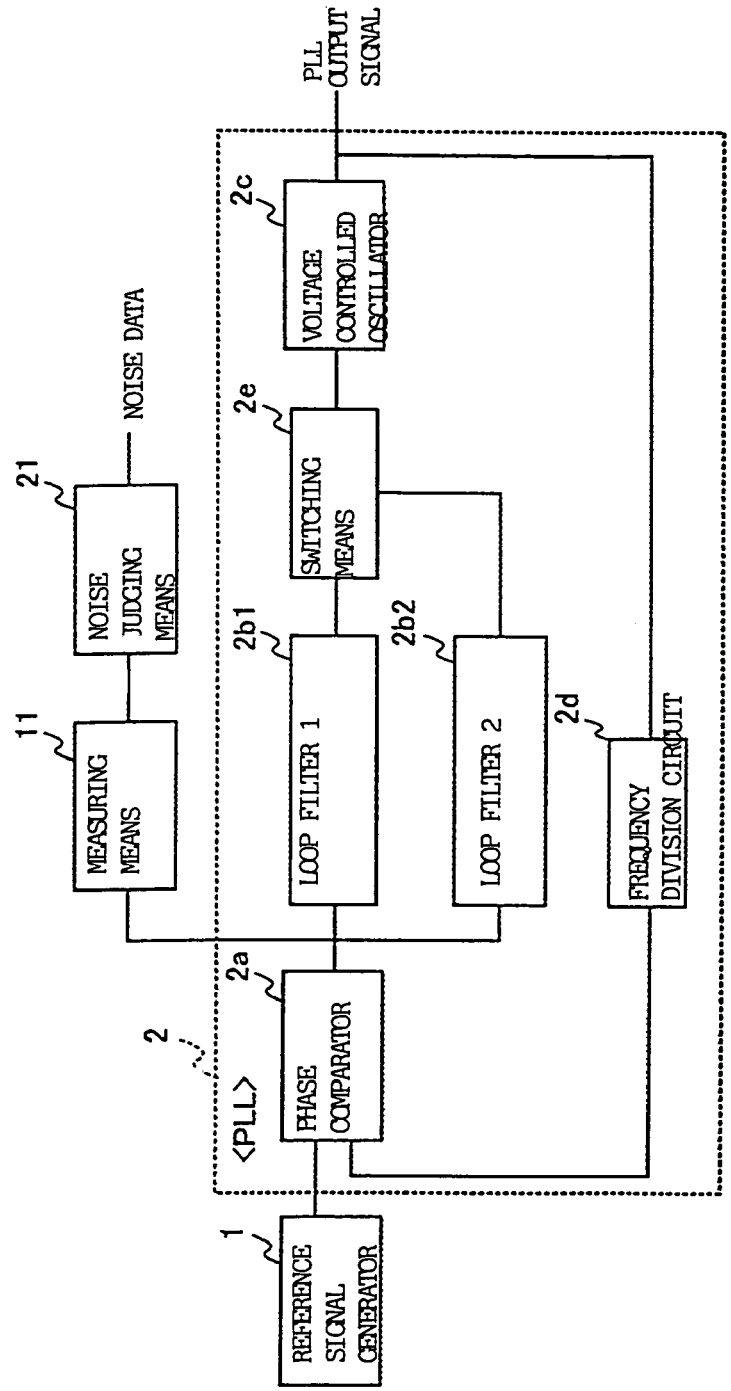
FIG. 10 shows a modified example of a noise detection device in which a plurality of loop filters with different noise sensitivity levels are provided, instead of providing single loop filter as shown in FIG. 2, and one of them is selected by means of switching means.
Figure 15A:
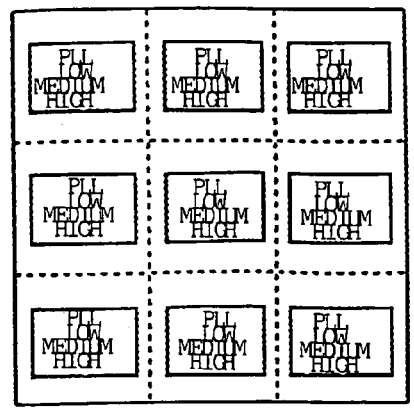
FIG. 15 illustrates an example of noise distribution.

In addition, by changing the noise sensitivity of the PLLs arranged on the printed circuit board, the noise distribution of the system can be displayed in accordance with the noise tolerance of the system. FIG. 15A is an example of a noise distribution. A PLL that is constituted to enable the noise sensitivity to be changed as per the configuration shown in FIG. 10 is arranged in each region of the printed circuit board. FIG. 10 shows an example in which the noise sensitivity is set in three stages, namely low sensitivity, medium sensitivity and high sensitivity.

Figure 15B:
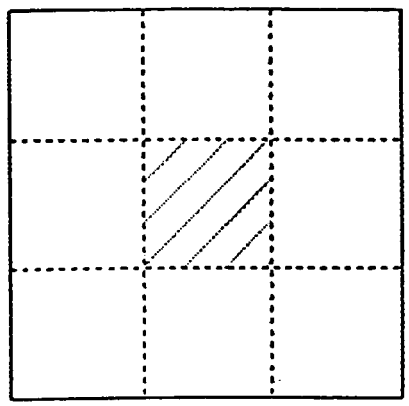
Figure 15C:
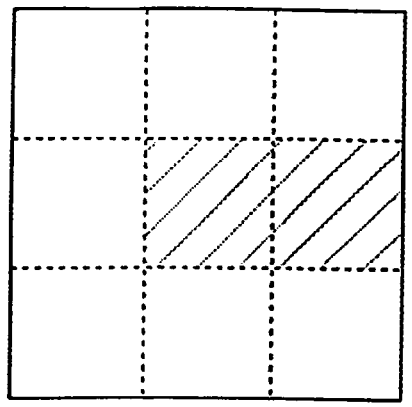
Figure 15D:
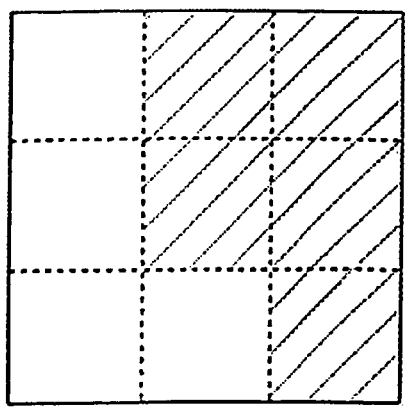

Here, supposing that the noise source is in a position above and to the right of center of the printed circuit board, when the noise sensitivity is set low, only the PLL in the center region detects noise and the noise distribution shown in FIG. 15B is obtained. Further, when the noise sensitivity is set to medium, the PLLs in the center region and in the center right-hand region detect noise, for example, and the noise distribution shown in FIG. 15C is obtained. When the noise sensitivity is set to high, the PLLs in the top center region, right-hand region, center region, center right-hand region and lower right-hand region detect noise, for example, and the noise distribution shown in FIG. 15D is obtained.

The noise detection device of the present invention is able to detect noise that is fatal to the system through the use of a PLL that is the most susceptible to noise in the system. Further, the PLL is contained in virtually all the ASICs used by the system and a noise detection circuit can be implemented by means of simple circuit addition. Therefore, noise detection is possible at a large number of points in the system without an increase in costs.

The noise detection device of the present invention can be applied to a variety of electronic devices, electric devices, and so forth and, more particularly, in the case of an electronic device that contains a circuit that uses a plurality of clock signals, because a PLL is used for the formation of the clock signal, the PLL that the circuit itself comprises can be used.

What is claimed is:

1. An electronic device having a noise detection function, comprising:
   a plurality of the noise detection devices; and
   a position detection device,
   each of said plurality of noise detection devices comprising:
      a reference signal generator that generates a reference signal,
      a Phase Lock Loop (PLL) comprising:
         a voltage controlled oscillator that controls an output frequency based on a control voltage, and
         a phase comparator that compares a phase of a signal outputted from the voltage controlled oscillator with a phase of the reference signal and provides an output voltage to be used for obtaining said control voltage and which outputs a signal that is in synchronization with the reference signal from the voltage controlled oscillator;
   measuring means for measuring a jitter amount from the output signal of said PLL; and
   judging means for judging a degree of a risk of a malfunction caused by noise interference based on an output of said measuring means,
   said position detecting device detecting a position in which noise is detected based on an output of said judging means in each of the plurality of noise detection devices,
   wherein a plurality of the noise detection devices having different noise sensitivity levels are provided; and
   a noise detection device of high noise sensitivity is placed in a part of a printed circuit board that is susceptible to noise and a noise detection device of low noise sensitivity is placed in a part of the printed circuit board that is resistant to noise so that noise which occurs in the printed circuit board is detected.

2. An electronic device having a noise detection function, comprising:
   a plurality of the noise detection devices; and
   a position detection devices,
   each of said plurality of noise detection devices comprising:
      a reference signal generator that generates a reference signal,
      a Phase Lock Loop (PLL) comprising:
         a voltage controlled oscillator that controls an output frequency based on a control voltage, and
         a phase comparator that compares a phase of a signal outputted from the voltage controlled oscillator with a phase of the reference signal and provides an output voltage to be used for obtaining said control voltage and which outputs a signal that is in synchronization with the reference signal from the voltage controlled oscillator;
   measuring means for measuring a jitter amount from the output signal of said PLL; and
   judging means for judging a degree of a risk of a malfunction caused by noise interference based on an output of said measuring means,
   said position detecting device detecting a position in which noise is detected based on an output of said judging means in each of the plurality of noise detection devices.

3. The electronic device having a noise detection function according to claim 2, wherein said PLL is mounted in an ASIC and is a PLL that is set for an ASIC specific application and/or a PLL that is set for noise detection.

4. The electronic device having a noise detection function according to claim 2, further comprising:
   a display that displays noise information of said position detection device.

5. The electronic device having a noise detection function according to claim 2, further comprising:
   storage means for storing noise information of said position detection device.

6. The electronic device having a noise detection function according to claim 2, wherein a plurality of PLLs with different noise sensitivity characteristics is provided on the same printed circuit board.

7. The electronic device having a noise detection function according to claim 2, further comprising:
   changing means for changing the noise sensitivity characteristic of said PLL.

8. The electronic device having a noise detection function according to claim 7, wherein said changing means comprises a plurality of loop filters with different characteristics and switching means for performing switching by selecting any one of the plurality of loop filters.

9. The electronic device having a noise detection function according to claim 2, wherein said measuring means is configured to measure the output of the phase comparator.

10. The electronic device having a noise detection function according to claim 2, further comprising a loop filter that retrieves a DC component from the output of the phase comparator and outputs the control voltage for the voltage controlled oscillator, wherein
said measuring means is configured to measure the output of said loop filter.

11. A noise detection method, comprising:
providing a plurality of noise detection devices with different noise sensitivity levels; and
detecting noise that occurs in a printed circuit board by placing a noise detection device of high noise sensitivity in a part that is susceptible to noise and placing a noise detection device of low noise sensitivity in a part that is resistant to noise, respectively, on the printed circuit board, wherein each of the plurality of the noise detection devices, comprising:
a reference signal generator that generates a reference signal,
a Phase Lock Loop (PLL) comprising a voltage controlled oscillator that controls the output frequency based on a control voltage, and a phase comparator that compares the phase of the signal outputted from the voltage controlled oscillator with the phase of the reference signal and provides an output voltage to be used for obtaining said control voltage, and that outputs a signal that is in synchronization with the reference signal from the voltage controlled oscillator,
measuring means for measuring the jitter amount from the output signal of said PLL, and
judging means for judging an existence of noise on a basis of a jitter amount measured by said measuring means.

* * * * *

UNITED STATES PATENT AND TRADEMARK OFFICE
CERTIFICATE OF CORRECTION

PATENT NO. : 7,519,113 B2  
APPLICATION NO. : 11/037003  
DATED : April 14, 2009  
INVENTOR(S) : Kazunari Aoyama et al.

Page 1 of 1

It is certified that error appears in the above-identified patent and that said Letters Patent is hereby corrected as shown below:

Column 1, Line 17, change "convertinga" to --converting a--.

Column 12, Line 23 claim 2, change "devices," to --device,--.

Signed and Sealed this

Thirtieth Day of June, 2009

JOHN DOLL  
*Acting Director of the United States Patent and Trademark Office*